US006821891B2

(12) United States Patent
Chen et al.

(10) Patent No.: US 6,821,891 B2
(45) Date of Patent: Nov. 23, 2004

(54) ATOMIC LAYER DEPOSITION OF COPPER USING A REDUCING GAS AND NON-FLUORINATED COPPER PRECURSORS

(75) Inventors: Ling Chen, Sunnyvale, CA (US); Mei Chang, Saratoga, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 10/295,770

(22) Filed: Nov. 15, 2002

(65) Prior Publication Data

US 2003/0129308 A1 Jul. 10, 2003

Related U.S. Application Data

(60) Provisional application No. 60/333,200, filed on Nov. 16, 2001.

(51) Int. Cl.[7] .................... H01L 21/44; H01L 21/4763
(52) U.S. Cl. .................... 438/687; 438/681; 438/653; 438/905
(58) Field of Search .................... 438/687, 681, 438/680, 653, 761, 763, 905; 427/576, 585

(56) References Cited

U.S. PATENT DOCUMENTS

| 3,594,216 A | 7/1971 | Charles et al. ............ 117/107.2 |
| 5,391,517 A | * 2/1995 | Gelatos et al. .............. 438/643 |

(List continued on next page.)

FOREIGN PATENT DOCUMENTS

| DE | 42 02 889 A1 | 8/1993 | ......... C07C/211/65 |
| EP | 0 328 333 A2 | 8/1989 | ........... H01L/39/24 |
| EP | 0 369 297 A1 | 5/1990 | ......... C07C/251/08 |
| JP | 2001-111000 | 4/2001 | ......... H01L/27/105 |
| WO | WO 97/22731 | 6/1997 | ........... C23C/16/06 |
| WO | 00/54320 | 9/2000 | ........... H01L/21/44 |
| WO | 01/15220 | 3/2001 | ......... H01L/21/768 |
| WO | 01/27347 | 4/2001 | ........... C23C/16/44 |
| WO | 01/29891 | 4/2001 | ......... H01L/21/768 |
| WO | 01/29893 | 4/2001 | ......... H01L/21/768 |
| WO | 01/66832 | 9/2001 | ........... C30B/25/14 |
| WO | 01/88972 | 11/2001 | ......... H01L/21/321 |
| WO | 02/45167 | 6/2002 | ........... H01L/27/00 |
| WO | 02/45871 | 6/2002 | ............ B05D/3/04 |
| WO | 02/067319 | 8/2002 | ......... H01L/21/768 |

OTHER PUBLICATIONS

Solanki, et al. "Atomic Layer Deposition of Copper Seed Layers," Electrochemical and Solid State Letters, vol. 3, No. 10 (2000).

Juppo, et al. "Deposition of Copper Films by an Alternate Supply of CuCl and Zn," J. Vac. Sci. Technol. A 15(4), Jul./Aug. 1997.

(List continued on next page.)

Primary Examiner—Ha Tran Nguyen
(74) Attorney, Agent, or Firm—Moser Patterson & Sheridan LLP

(57) ABSTRACT

Methods of forming copper films by sequentially introducing and then reacting nitrogen containing analogs of Copper II β-diketonates which analogs are more stable source reagents for copper deposition. The nitrogen containing analogs replace —O— with —N(R")— wherein R" is an alkyl group having from one to four carbon atoms. Replacement of each —O— is preferred although replacement of one —O— per cyclic ring is sufficient to improve stability of the copper source reagents. The source reagent can be purified by sublimation to remove solvents and excess ligands prior to semiconductor processing. The processing chamber is preferably a cyclical deposition chamber maintained at a pressure of less than about 10 Torr and the substrate is maintained at a temperature of about 50 to about 200° C.

3 Claims, 5 Drawing Sheets

U.S. PATENT DOCUMENTS

| | | | | |
|---|---|---|---|---|
| 5,464,666 | A | 11/1995 | Fine et al. | 427/576 |
| 5,916,365 | A | 6/1999 | Sherman | 117/92 |
| 6,200,893 | B1 | 3/2001 | Sneh | 438/685 |
| 6,203,613 | B1 | 3/2001 | Gates et al. | 117/104 |
| 6,270,572 | B1 | 8/2001 | Kim et al. | 117/93 |
| 6,284,646 | B1 | 9/2001 | Leem | 438/629 |
| 6,305,314 | B1 | 10/2001 | Sneh et al. | 118/723 R |
| 6,342,277 | B1 | 1/2002 | Sherman | 427/562 |
| 6,358,829 | B2 | 3/2002 | Yoon et al. | 438/597 |
| 6,391,785 | B1 * | 5/2002 | Satta et al. | 438/704 |
| 6,464,779 | B1 | 10/2002 | Powell et al. | 117/89 |
| 6,475,276 | B1 | 11/2002 | Elers et al. | 117/84 |
| 6,482,733 | B2 | 11/2002 | Raaijmakers et al. | 438/633 |
| 6,482,740 | B2 | 11/2002 | Soininen et al. | 438/686 |
| 6,534,395 | B2 | 3/2003 | Werkhoven et al. | 438/627 |
| 2001/0000866 | A1 | 5/2001 | Sneh et al. | 118/723 R |
| 2001/0009695 | A1 | 7/2001 | Saanila et al. | 427/255.39 |
| 2001/0028924 | A1 | 10/2001 | Sherman | 427/255.28 |
| 2001/0041250 | A1 | 11/2001 | Werkhoven et al. | 428/212 |
| 2002/0031618 | A1 | 3/2002 | Sherman | 427/569 |
| 2002/0068454 | A1 | 6/2002 | Chiang et al. | 438/694 |
| 2002/0073924 | A1 | 6/2002 | Chiang et al. | 118/723 I |
| 2002/0076481 | A1 | 6/2002 | Chiang et al. | 427/8 |
| 2002/0076507 | A1 | 6/2002 | Chiang et al. | 427/569 |
| 2002/0076508 | A1 | 6/2002 | Chiang et al. | 427/569 |
| 2002/0076837 | A1 | 6/2002 | Hujanen et al. | 438/3 |
| 2002/0092584 | A1 | 7/2002 | Soininen et al. | 148/282 |
| 2002/0098685 | A1 | 7/2002 | Sophie et al. | 438/633 |
| 2002/0104481 | A1 | 8/2002 | Chiang et al. | 118/723 I |
| 2002/0127336 | A1 | 9/2002 | Chen et al. | 427/250 |
| 2002/0144655 | A1 | 10/2002 | Chiang et al. | 118/715 |
| 2002/0144657 | A1 | 10/2002 | Chiang et al. | 118/723 E |
| 2002/0146511 | A1 | 10/2002 | Chiang et al. | 427/248.1 |
| 2002/0155722 | A1 | 10/2002 | Satta et al. | 438/704 |
| 2002/0164421 | A1 | 11/2002 | Chiang et al. | 427/248.1 |
| 2002/0164423 | A1 | 11/2002 | Chiang et al. | 427/255.28 |
| 2002/0187256 | A1 | 12/2002 | Elers et al. | 427/99 |
| 2002/0187631 | A1 | 12/2002 | Kim et al. | 438/637 |
| 2002/0197402 | A1 | 12/2002 | Chiang et al. | 427/255.39 |
| 2003/0032281 | A1 | 2/2003 | Werkhoven et al. | 438/640 |
| 2003/0042630 | A1 | 3/2003 | Babcoke et al. | 261/121.1 |
| 2003/0054631 | A1 | 3/2003 | Raaijmakers et al. | 438/633 |
| 2003/0082296 | A1 | 5/2003 | Elers et al. | 427/96 |
| 2003/0097013 | A1 | 5/2003 | Chen et al. | 556/1 |
| 2003/0129826 | A1 | 7/2003 | Werkhoven et al. | 438/627 |
| 2003/0134508 | A1 | 7/2003 | Raaijmakers et al. | 438/638 |
| 2003/0143839 | A1 | 7/2003 | Raaijmakers et al. | 438/633 |

OTHER PUBLICATIONS

Martensson, et al. "Use of Atomic Layer Epitaxy for Fabrication of Si/TiN/Cu Structures," J. Vac. Sci. Technol. B 17(5), Sep./Oct. 1999).

Martensson, et al. "Atomic Layer Epitaxy of Copper on Tantalum," Chem. Vap. Deposition 1997, 2 No. 1.

Utriainen, et al. "Studies of Metallic Thin Film Growth in an Atomic Layer Epitaxy Reactor Using $M(acac)_2$ (M–Ni, Cu, Pt) Precursors," Applied Surface Science 157 (2000) 151–158.

Martensson, et al. "Atomic Layer Epitaxy of Copper, Growth & Selectivity in the Cu(II)–2,2.6.6–Tetramethyl–3, 5–Heptanedion ate/$H_2$ Process," J. Elec. Society, vol. 145, No. 8 (1998).

International Search Report dated Jul. 30, 2003 for PCT/US02/36713.

U.S. patent application No. 09/451,628, filed Nov. 30, 1999.
U.S. patent application No. 10/016,300, filed Dec. 12, 2001.
U.S. patent application No. 10/032,284, filed Dec. 12, 2001.
PCT Partial Search Report dated Mar. 10, 2002 for PCT/US02/36713.

"Synthesis and properties of some β–diketimines derived from acetylacetone, and their metal complexes", S.G. McGeachin, Department of Chemistry, University of Alberta, Canadian Journal of Chemistry, vol. 46, 1968, pp. 1903–1912.

* cited by examiner

US 6,821,891 B2

ATOMIC LAYER DEPOSITION OF COPPER USING A REDUCING GAS AND NON-FLUORINATED COPPER PRECURSORS

CROSS-REFERENCE TO RELATED APPLICATIONS

This application claims benefit of U.S. provisional patent application Ser. No. 60/333,200, filed Nov. 16, 2001, which is herein incorporated by reference.

BACKGROUND OF THE INVENTION

1. Field of the Invention

Embodiments of the present invention relate to deposition methods for forming thin metal films, such as copper films, on substrates for use in manufacturing semiconductor devices, flat-panel display devices, and other electronic devices.

2. Description of the Related Art

In the field of semiconductor processing, flat-panel display processing or other electronic device processing, chemical vapor deposition has played an important role in forming films on substrates. As the geometries of electronic devices continue to shrink and the density of devices continues to increase, the size and aspect ratio of the features are becoming more aggressive, e.g., feature sizes of 0.07 microns and aspect ratios of 10 or greater are being considered. Accordingly, conformal deposition of materials to form these devices is becoming increasingly important.

While conventional chemical vapor deposition has proved successful for device geometries and aspect ratios up to 0.15 microns, the more aggressive device geometries require new, innovative deposition techniques. One technique which is receiving considerable attention is rapid cycle (pulsed) CVD or atomic layer deposition. In this scheme, reactants are sequentially introduced into a processing chamber where each reactant adsorbs onto the surface of the substrate where a surface reaction occurs. A purge step is typically carried out between the delivery of each reactant gas. The purge step may be a continuous purge with the reactant gases or a pulse purge between the delivery of the reactant gases.

Materials which are useful in forming conductive devices in semiconductor as well as flat-panel display processing include copper, titanium, tantalum, aluminum, tungsten, and nitrides of the refractory metals.

Chemical vapor deposition of copper has been a difficult process to incorporate into commercial production. One problem has been the difficulty in determining or finding a suitable precursor. Existing copper precursors have contained additional elements such as fluorine that can impede their use as a suitable precursor for electronic applications, or have a chemical composition that is not suited for large scale production of electronic components. For example, some potential source reagents are solids that are amenable to sublimation for gas-phase transport into the processing chamber, however the sublimation temperature may be very close to the decomposition temperature. Accordingly, the reagent may begin to decompose in transit. As a result, accurate delivery of reagent is impeded and additional chamber cleaning would be required.

Thermal decomposition of organometallic source reagents is a particularly attractive method for forming metal films because it is readily scaled up to production runs and because the electronics industry has a wide experience and an established equipment base in the use of vaporization and decomposition technology.

Semiconductor processing requires source reagents that are sufficiently volatile to permit their gas phase transport into the processing chamber. The source reagent must decompose in the chamber to deposit only the desired element(s) at the desired growth temperature on the substrate. Premature gas phase reactions are desirably avoided, and it generally is desired to controllably deliver source reagents into the reactor to effect correspondingly close control of film stoichiometry.

Therefore, there is a need for a deposition process and a copper precursor which can reliably form copper layers in very small aggressive geometries.

SUMMARY OF THE INVENTION

Embodiments of the present invention provide deposition processes in which nitrogen containing analogs of Copper II β-diketonates, are reduced using moderate reducing agents. The nitrogen containing analogs replace —O— with —N(R")— wherein R" is an alkyl group having from one to four carbon atoms. Replacement of each —O— is preferred although replacement of one —O— per cyclic ring is sufficient to improve stability of the copper source reagents. The nitrogen containing analogs are preferably separated from solvents and excess ligands by sublimation. The processes are performed at chamber pressures in the range of about 0.1 to about 10 Torr at substrate temperatures of about 50 to about 200° C.

In one embodiment, the copper layer of the present invention is deposited by the cyclical deposition technique using the nitrogen containing analogs of Copper II β-diketonates and the reducing agent to provide a copper layer that may contain carbon, nitrogen, and oxygen constituents. The copper layer adheres well to copper barrier layers.

DETAILED DESCRIPTION OF THE INVENTION

Embodiments of the present invention relate to an atomic layer deposition (also known as a rapid chemical vapor deposition) process for forming a copper layer on a substrate. A copper precursor, preferably selected from nitrogen containing analogs of Copper II β-diketonates which analogs are excellent source reagents for copper deposition is sequentially introduced into a processing chamber with a reducing gas and a surface reaction occurs on the substrate to form the film a thin layer, thought to be a monolayer, at a time. Preferably solvents and excess ligands are substantially removed prior to the introduction into the processing chamber.

Reducing gases which may be used in conjunction with a copper precursor include, but are not limited to, hydrogen, silane organosilanes, ammonia, diborane and combinations thereof. A purge gas is continually delivered into the chamber with the reactant gases, or is alternately pulsed into the chamber between the reactant gases, to clear each gas, e.g., the copper precursor and the reducing gas, before the other is introduced into the chamber so that a co-reaction type process is not carried out.

The nitrogen containing analogs replace —O— with —N(R")— wherein R" is an alkyl group having from one to four carbon atoms. Replacement of each —O— in the analog is preferred although replacement of one —O— per cyclic ring is sufficient to improve stability of the copper source reagents, especially when separated from solvent and excess ligands. Purification by sublimation substantially removes solvents and excess ligands in comparison to solvent extraction methods.

In order to form a conformal film on a substrate, the substrate is heated to a temperature between about 50° C. and about 250° C. A copper reactant gas is introduced into the chamber through the gas delivery system of the chamber. The copper reactant gas is preferably introduced into the chamber with a purge gas, such as argon at a pressure from 0.1 Torr to 10 Torr. The purge gas is continuously delivered to the processing chamber and the copper reactant gas is pulsed into the continuous purge gas. The pulse of reactant gas may last up to two seconds. Following the pulse of copper reactant gas, the purge gas continues to flow for up to two seconds. Next, the reducing gas is delivered into the chamber with a continuous purge gas. The reducing gas is preferably pulsed for up to two seconds. The delivery of the copper reactant gas, the purge gas, the reducing gas and another purge gas completes one sequential deposition cycle. The deposition cycle is repeated until a desired amount of copper has been deposited.

Figure 1:
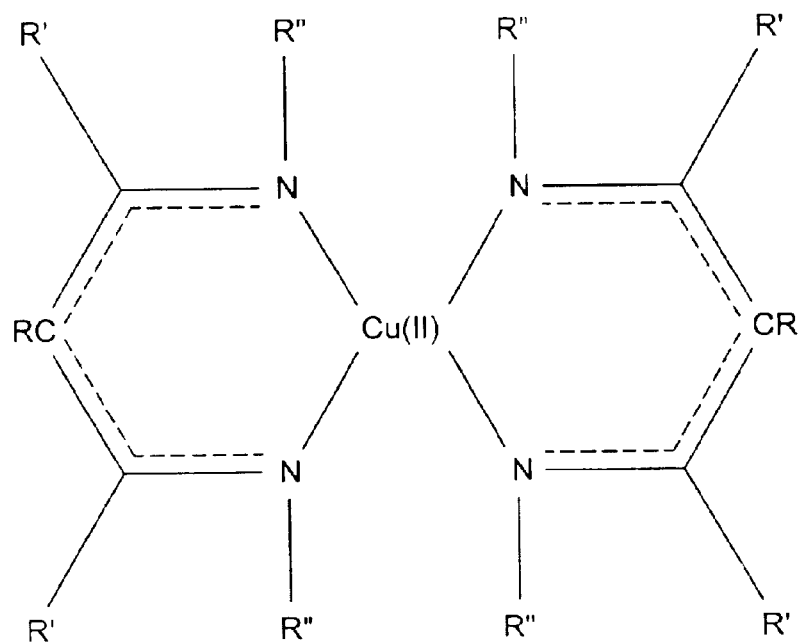
FIG. 1 is a generic structure for Copper II β-diketiminates of the present invention wherein R is hydrogen or methyl, R' is hydrogen on an alkyl group having from one to four carbon atoms, and R" is an alkyl group having from one to four carbon atoms.

FIG. 1 illustrates a generic structure for Copper II β-diketiminates which can be used to form copper films according to embodiments of the invention described herein. Compounds having the structure of FIG. 1 are similar to Copper II β-diketonates wherein R is typically hydrogen or methyl, and R' is typically hydrogen, an alkyl group, an aryl group, an alkylaryl group, an alkoxy group, or combinations thereof. For the present invention R is hydrogen or methyl, R' is hydrogen or an alkyl group having from one to four carbon atoms, and R" is an alkyl group having from one to four carbon atoms. Preferably, R and R" are hydrogen and R" is ethyl.

Figure 2:
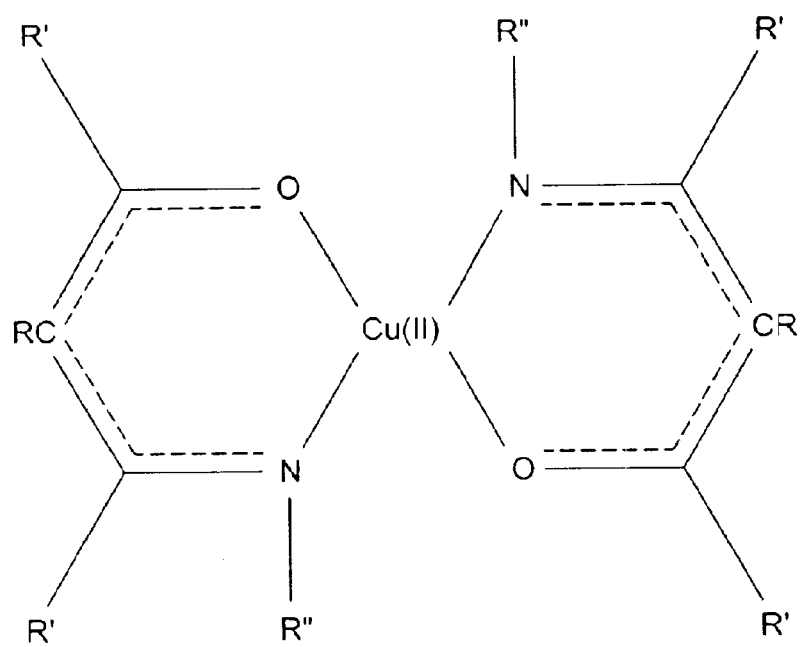
FIG. 2 is a generic structure for Copper II β-ketoiminates of the present invention wherein R is hydrogen or methyl, R' is hydrogen or an alkyl group having from one to four carbon atoms, and R" is an alkyl group having from one to four carbon atoms.

FIG. 2 illustrates a generic structure for Copper II β-ketoiminates. Compounds having the structure of FIG. 2 are similar to Copper II β-diketonates wherein R is typically hydrogen or methyl, and R' is typically hydrogen, an alkyl group, an aryl group, an alkylaryl group, an alkoxy group, or combinations thereof. For the present invention R is hydrogen or methyl, R' is hydrogen or an alkyl group having from one to four carbon atoms, and R" is an alkyl group having from one to four carbon atoms. Preferably, R and R" are hydrogen and R" is ethyl.

The various source reagents employed in the invention may be readily made by conventional synthetic techniques, including those more fully described in S. G. McGeachin, "Synthesis And Properties Of Some β-Diketimines Derived From Acetylacetone, And Their Metal Complexes", Canadian Journal of Chemistry Vol. 46, No. 11, June 1968, or German Patent Publication 42 02 889 laid open on Aug. 5, 1993, the disclosures of which are incorporated herein by reference. However, purification of the source reagents by solvent extraction does not adequately remove solvents and excess ligands that may complex with the source reagents. The remaining impurities can substantially impair performance of the source reagents. The source reagents are improved by more rigorous purification methods such as separation of the purified source reagent by sublimation. Other methods for purification can be used if residual solvents or excess ligands are removed.

Hypothetical Example

According to the procedure described in German Patent Publication 42 02 8894, N,N'-diethyl-1,3-propanediketimine (0.17 mol) in 200 mL pentane is introduced into a 500-mL flask. Then 100 mL of a 1.6M solution of n-butyllithium in hexane is added slowly dropwise with stirring. Then 0.42 g (0.0032 mol) of copper dichloride is reacted with 2 molar equivalents (0.0063 mol) of the lithium N,N'-diethyl-1,3-propanediketiminate in diethyl ether. The precipitated lithium chloride is filtered off. The volatile components are evaporated off from the remaining solution in a vacuum, and then the residue is purified by washing with pentane.

In order to enhance film stability, the purified residue is further purified by sublimation at 100–150° C. at about 10 mTorr to remove solvents and excess N,N'-diethyl-1,3-propanediketimine.

Reducing gases which can be used to react with and reduce the copper precursor gases disclosed herein include hydrogen, silane, organosilanes, ammonia diborane or combinations thereof. Organosilanes include compounds such as methylsilane, dimethylsilane, trimethylsilane and other known organic silanes. The reducing gas is selected to react with the copper precursor adsorbed on the substrate. The reducing gas is preferably a moderate reducing gas which requires some amount of activation energy to react with the copper precursor. A moderate reducing gas preferably provides selective deposition on a substrate and minimizes deposition/adsorption on components of the processing chamber. It is believed that the reducing gases described herein react with the copper precursor at temperatures in the range of about 50 to about 200° C. This temperature enables the process and the processing chamber to be tuned to enable selective deposition on the substrate. The other chamber components are preferably maintained at a temperature less than about 50° C.

The mode of operation described herein is referred to as sequential delivery of process gases. A sequential process according to the invention is distinguishable from a co-reaction process, such as conventional CVD deposition, in which the process gases are delivered simultaneously into the chamber. It is believed that the sequential process of the present invention provides improved conformal deposition and better conformal of process conditions.

An embodiment of the present invention is described below in reference to a method of copper metallization that includes depositing a copper layer in a cyclical deposition chamber such as the chamber described in U.S. patent application Ser. No. 10/032,284, entitled "Gas Delivery Apparatus and Method For Atomic Layer Deposition", filed on Dec. 21, 2001, which is incorporated herein by reference herein to the extent not inconsistent with the claimed aspects and description herein. A brief description of the processing chamber follows. Another suitable processing chamber for performing the processes described herein is described in commonly assigned U.S. patent application Ser. No. 10/016, 300, filed on Dec. 12, 2001, which is incorporated herein by reference. Both processing chambers are available from Applied Materials, Inc. located in Santa Clara, Calif.

Figure 3:
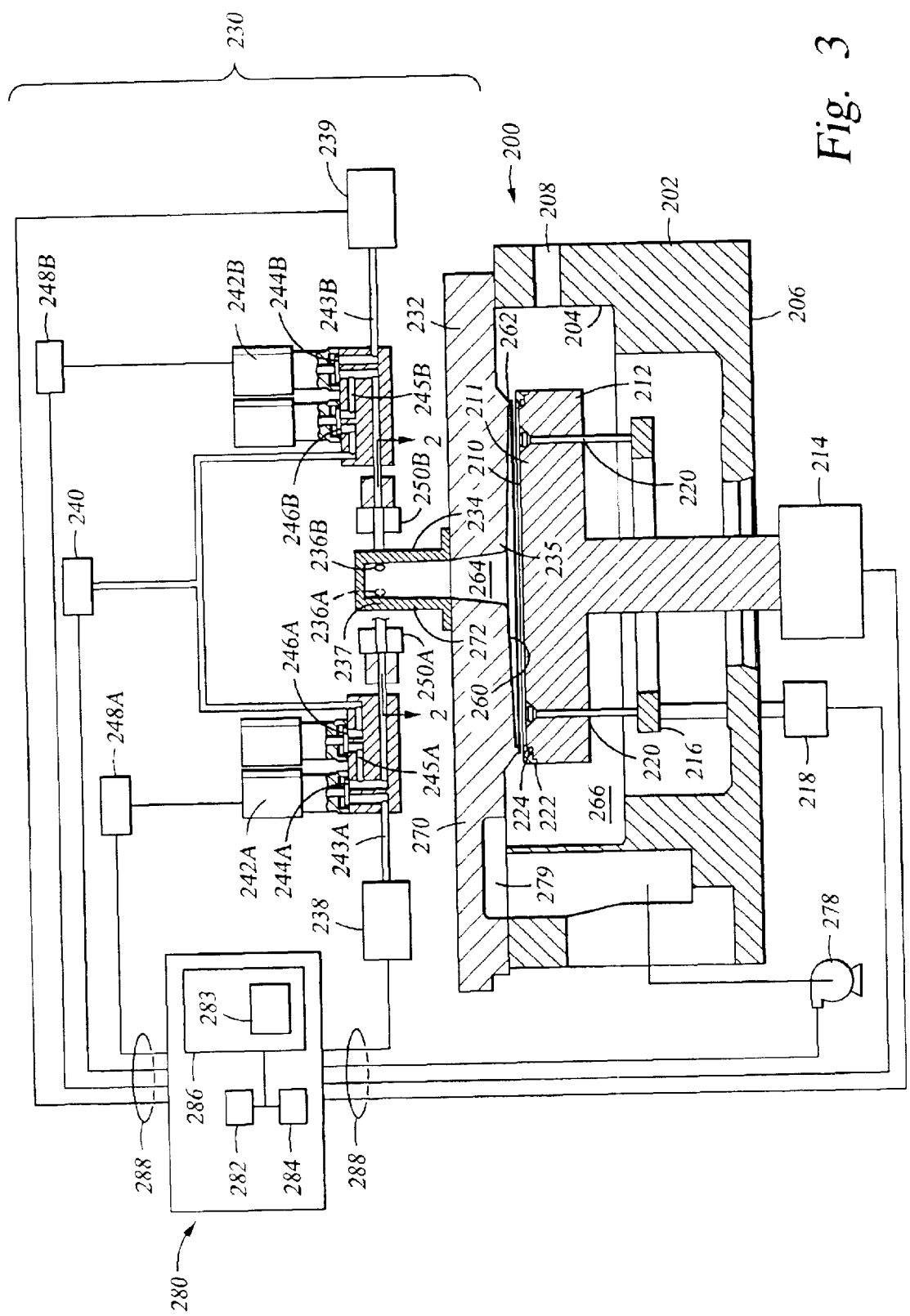
FIG. 3 is a cross sectional view of one processing chamber which can be used to advantage to deposit a copper film according to embodiments of the invention.

FIG. 3 illustrates a schematic, partial cross section of an exemplary processing chamber 200 for use in a method of forming a copper layer according to each of the embodiments of the present invention. The processing chamber 200 may be integrated into an integrated processing platform, such as an Endura™ platform also available from Applied Materials, Inc. Details of the Endura™ platform are described in commonly assigned U.S. patent application Ser. No. 09/451,628, entitled "Integrated Modular Processing Platform", filed on Nov. 30, 1999, which is incorporated by reference herein.

Referring to FIG. 3, the processing chamber 200 includes a chamber body 202 and a movable substrate support 212 disposed in the chamber to support a substrate 210. The substrate support 212 may include a vacuum chuck, an electrostatic chuck, or a clamp ring for securing the substrate 212 to the substrate support 212 during processing. The substrate support 212 may be heated using an embedded heating element, such as a resistive heater, or may be heated using radiant heat, such as heating lamps disposed above the substrate support 212. A purge ring 222 may be disposed on the substrate support 212 to define a purge channel 224 which provides a purge gas to a peripheral portion of the substrate 210 to prevent deposition thereon.

The chamber 200 includes a vacuum system 278 in communication with a pumping channel 279 to evacuate any desired gases from the chamber 200 and to help maintain a desired pressure or a desired pressure range inside a pumping zone 266 of the chamber 200.

A gas delivery apparatus 230 is disposed at an upper portion of the chamber body 202 to introduce the copper precursors, the reducing gases and the purge gases into the chamber 200. The gas delivery apparatus 230 comprises a chamber lid 232 which includes an expanding channel 234 and a bottom surface 260. The bottom surface 260 is sized and shaped to substantially cover a substrate 210 disposed on the substrate support 212. The expanding channel 234 has gas inlets 236A, 236B to provide gas flows from two similar valves 242A, 242B. The gas flows from the valves 242A, 242B may be provided together and/or separately. The valves 242A, 242B may be pneumatically actuated or may be electrically actuated. Programmable logic controller 248A, 248B may be coupled to the valves 242A, 242B to control actuation of the valves 242A, 242B. An electrically actuated valve typically requires the use of a driver coupled between the valve and the programmable logic controller. The valves 242A, 242B may be zero dead volume valves to enable rapid flushing of a reactant gas from the delivery lines of the valve 242A, 242B.

Valves 242A and 242B are coupled to one or the other of the separate copper precursors and the reducing gases. Each is coupled to a purge gas source, preferably the same purge gas source. For example, valve 242A is coupled to reactant gas source 238 and valve 242B is coupled to reactant gas source 239, and both valves 242A, 242B are coupled to purge gas source 240. Each valve 242A, 242B may be adapted to provide a combined gas flow and/or separate gas flows of the reactant gas 238, 239 and the purge gas 240.

In reference to valve 242A, one example of a combined gas flow of the reactant gas 238 and the purge gas 240 provided by valve 242A comprises a continuous flow of a purge gas from the purge gas source 240 and pulses of a reactant gas from the reactant gas source 238. In reference to valve 242A, one example of separate gas flows of the reactant gas 238 and the purge gas 240 provided by valve 242A comprises pulses of a purge gas from the purge gas source 240 and pulses of a reactant gas from the reactant gas source 238.

The delivery lines of the valves 242A, 242B may be coupled to the gas inlets 236A, 236B through gas conduits 250A, 250B. Each gas conduit 250A, 250B and gas inlet 236A, 236B may be positioned in any relationship to a longitudinal axis 290 of the expanding channel. Each gas conduit 250A, 250 B and gas inlet 236A, 236B are preferably positioned normal (in which $+\beta$, $-\beta$=to 90°) to the longitudinal axis 290 or positioned at an angle $+\beta$ or an angle $-\beta$ (in which 0°<$+\beta$<90°; 0°<$-\beta$<90°) from the centerline 302A, 302B of the gas conduit 250A, 250B to the longitudinal axis 290. Therefore, the gas conduit 250A, 250B may be positioned horizontally normal to the longitudinal axis 290 as shown in FIG. 3, may be angled downwardly at an angle $+\beta$ or may be angled upwardly at an angle $-\beta$ to provide a gas flow toward the walls of the expanding channel 234 rather than directly downward towards the substrate 210 which helps reduce the likelihood of blowing off reactants absorbed on the surface of the substrate 210. In addition, the diameter of the gas conduits 250A, 250B may be increasing from the delivery lines of the valves 242A, 242B to the gas inlets 236A, 236B to help reduce the velocity of the gas flow prior to its entry into the expanding channel 2,34. For example, the gas conduits 250A, 250B may comprise an inner diameter which is gradually increasing or may comprise a plurality of connected conduits having increasing inner diameters. The expanding channel 234 comprises a channel which has an inner diameter which increases from an upper portion 237 to a lower portion 235 adjacent the bottom surface 260 of the chamber lid 232. In one aspect, the diameter of the expanding channel 234 is gradually increasing from the upper portion 237 to the lower portion 235 of the expanding channel to allow less of an adiabatic expansion of a gas through the expanding channel 234 which helps to control the temperature of the gas. In one embodiment, the gas inlets 236A, 236B are located adjacent the upper portion 237 of the expanding channel 234.

At least a portion of the bottom surface 260 of the chamber lid 232 from the expanding channel 234 may be downwardly slopping or funnel shaped to help provide an improved velocity profile of a gas flow from the expanding channel 234 across the surface of the substrate 210 (i.e., from the center of the substrate to the edge of the substrate). In one aspect, the bottom surface 260 is downwardly sloping to help reduce the variation in the velocity of the gases as it travels between the bottom surface 260 of the chamber lid 232 and the substrate 210 to help provide uniform exposure of the surface of the substrate 210 to a reactant gas.

The chamber lid 232 may have a choke 262 at a peripheral portion of the chamber lid 232 adjacent the perimeter of the substrate 210. The choke 262 may comprise any circumferential downwardly extending protrusion. The choke 262 helps provide a more uniform pressure distribution within the volume or a reaction zone 264 defined between the chamber lid 232 and the substrate 210 by isolating the reaction zone 264 from the non-uniform pressure distribution of the pumping zone 266 (FIG. 3).

In one aspect, since the reaction zone 264 is isolated from the pumping zone 266, a minimal amount of reactant gas or purge gas adequately fills the reaction zone 264 to ensure sufficient exposure of the substrate 210 to the reactant gas or purge gas. In conventional chemical vapor deposition, a chamber is required to provide a combined flow of reactants simultaneously and uniformly to the entire surface of the substrate in order to ensure that the co-reaction of the reactants occur uniformly across the surface of the substrate. In atomic layer deposition based cyclical processing system, reactants are introduced sequentially into the chamber to provide absorption of alternating thin layers of the reactants onto the surface of the substrate. Instead, a flow of a reactant needs to be provided repetitively in an amount that is sufficient to absorb a thin layer of the reactant on the surface of the substrate. Since the reaction zone 264 may comprise a smaller volume when compared to the inner volume of a conventional CVD chamber, a smaller amount of gas is required to fill the reaction zone 264 for a particular process in an atomic layer deposition sequence. Because of the smaller volume of the reaction zone 264, less gas, whether a deposition gas or a purge gas, is necessary to be flowed into the chamber 200. Therefore, the throughput of the chamber 200 is greater and the waste may be minimized due to the smaller amount of gas used reducing the cost of operation.

The chamber lid 232, as shown, includes a cap portion 272 and a chamber plate portion 270 in which the cap portion 272 and the chamber plate portion 270 form the expanding channel 234. An additional plate may be optionally disposed between the chamber lid portion 270 and the cap portion 272. In other embodiments, the expanding channel 234 may be made integrally from a single piece of material.

The chamber lid 232 may include cooling elements and/or heating elements depending on the particular gas being delivered therethrough. Controlling the temperature of the chamber lid 232 may be used to prevent gas decomposition, deposition, or condensation on the chamber lid 232. For example, water channels may be formed in the chamber lid 232 to cool the chamber lid 232. In another example, heating elements may be embedded or may surround components of the chamber lid 232 to heat the chamber lid 232. In one embodiment, components of the chamber lid 232 may be individually heated or cooled. For example, referring to FIG. 3, the chamber lid 232 may comprise a chamber plate portion 270 and a cap portion 272 in which the chamber plate portion 270 and the cap portion 272 form the expanding channel 234. The cap may be maintained at one temperature range and the chamber lid may be maintained at another temperature range. For example, the cap 272 may be heated by being wrapped in heater tape or by using another heating device to prevent condensation of reactant gases and the chamber plate portion 270 may be maintained at ambient-temperature. In another example, the cap 272 may be heated and the chamber plate portion may be cooled with water channels formed therethrough to prevent thermal decomposition of reactant gases on the chamber plate portion 270.

The chamber lid 232 may be made of stainless steel, aluminum, nickel-plated aluminum, nickel, or other suitable materials. In one embodiment, the cap portion 272 comprises stainless steal and the chamber plate portion 270 comprises aluminum. In one embodiment, the additional plate comprises stainless steal.

A control unit 280 may be coupled to the chamber 200 to control processing conditions. For example, the control unit 280, may be configured to control flow of various process gases and purge gases from gas sources 238, 239, 240 through the valves 242A, 242B during different stages of a substrate process sequence. The control unit 280 may be coupled to another controller that is located adjacent individual chamber components, such as the programmable logic controllers 248A, 248B of the valves 242A, 242B. Bi-directional communications between the control unit 280 and various other components of the chamber 200 are handled through numerous signal cables collectively referred to as signal buses 288, some of which are illustrated in FIG. 3. In addition to control of process gases and purge gases from gas sources 238, 239, 240 and from the programmable logic controllers 248A, 248B of the valves 242A, 242B, the control unit 280 may be configured to be responsible for automated control of other activities used in wafer processing—such as wafer transport, temperature control, chamber evacuation, among other activities, some of which are described elsewhere herein.

In operation, a first gas flow may be injected into the expanding channel 234 of the chamber 200 by valve 242A together or separately (i.e. pulses) with a second gas flow injected into the chamber 200 by valve 242B. The first gas flow may comprise a continuous flow of a purge gas from purge gas source 240 and pulses of a reactant gas from reactant gas source 238 or may comprise pulses of a reactant gas from reactant gas source 238 and pulses of a purge gas from purge gas source 240. The second gas flow may comprises a continuous flow of a purge gas from purge gas source 240 and pulses of a reactant gas from reactant gas source 239 or may comprise pulses of a reactant gas from reactant gas source 239 and pulses of a purge gas from purge gas source 240. The gas flows travel through the expanding channel 234 as a vortex flow pattern 402 which provides a sweeping action across the inner surface of the expanding channel 234. The vortex flow pattern 402 dissipates to a downwardly flow 404 toward the surface of the substrate 210. The velocity of the gas flow reduces as it travels through the expanding channel 234. The gas flow then travels across the surface of the substrate 210 and across the bottom surface 260 of the chamber lid 232. The bottom surface 260 of the chamber lid 232, which is downwardly sloping, helps reduce the variation of the velocity of the gas flow across the surface of the substrate 210. The gas flow then travels by the choke 262 and into the pumping zone 266 of the chamber 200. Excess gas, by-products, etc. flow into the pumping channel 279 and are then exhausted from the chamber 200 by a vacuum system 278. In one aspect, the gas flows proceed through the expanding channel 234 and between the surface of the substrate 210 and the bottom surface 260 of the chamber lid 232 proceeds in a laminar manner which aids in an efficient exposure of a reactant gas to the surface of the substrate 210 and efficient purging of inner surfaces of the chamber lid 232.

Figure 4:
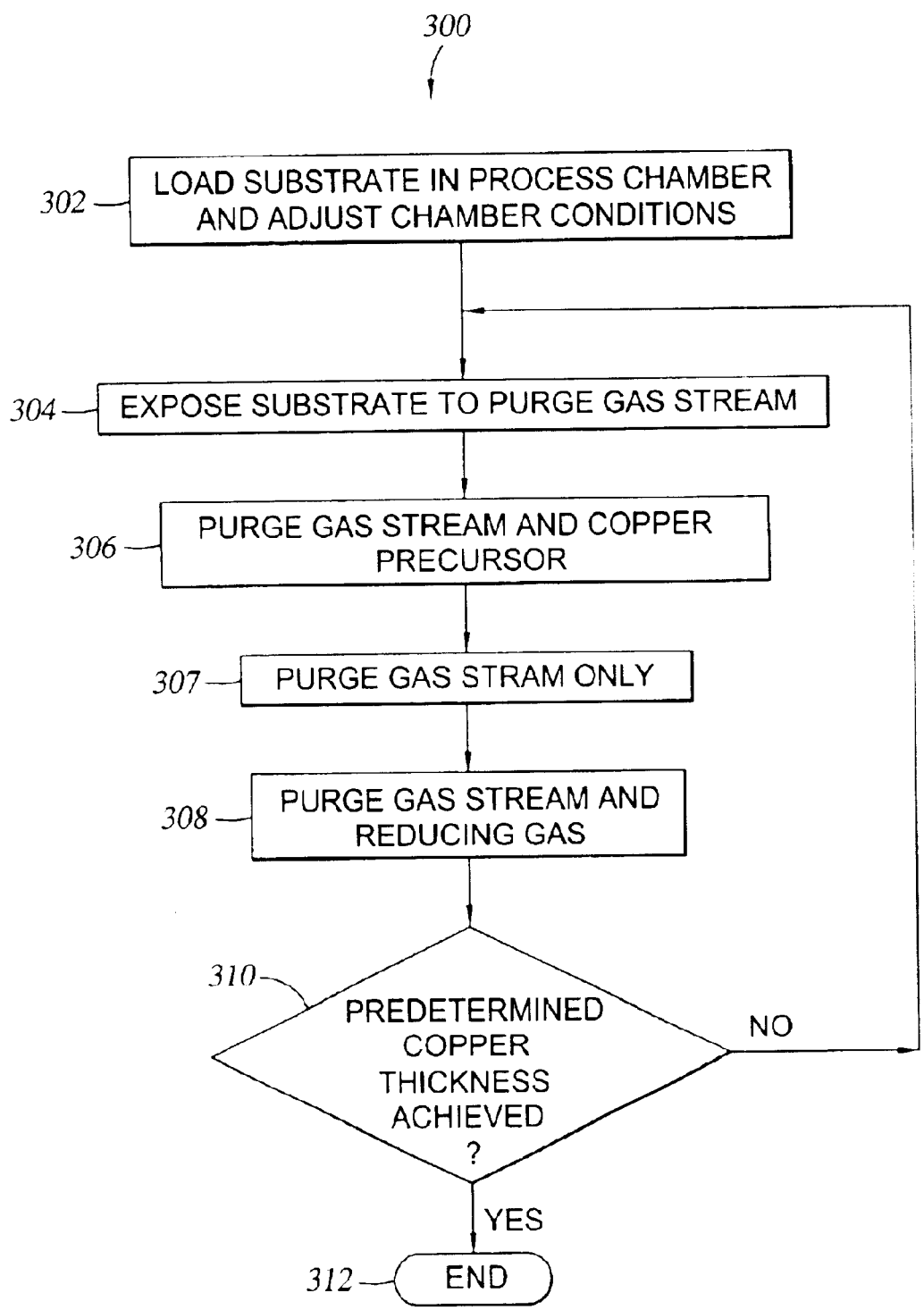
FIG. 4 illustrates a process sequence for the formation of a copper film using cyclical deposition techniques according to one embodiment described herein.

FIG. 4 illustrates an embodiment of a process sequence 300 according to the present invention comprising various steps used for the deposition of the copper layer utilizing a constant purge/carrier gas flow. As shown in step 302, a substrate is provided to the process chamber. The process chamber conditions such as, for example, the temperature and pressure are adjusted to enhance the adsorption of the process gases on the substrate. In general, for copper deposition, the substrate should be maintained at a temperature between about 50° C. and about 200° C.

In one embodiment where a constant purge/carrier gas flow is desired, a purge/carrier gas stream is established within the process chamber as indicated in step 304. Purge/carrier gases are selected to be non-reactive with process gases and volatile by-products. Carrier gases, such as, for example, helium (He), argon (Ar), nitrogen ($N_2$) and hydrogen ($H_2$), and combinations thereof, among others may be used.

Referring to step 306, after the purge/carrier gas stream is established within the process chamber, a pulse of a copper II β-diketonate compound is added to the purge/carrier gas stream. The term pulse as used herein refers to a dose of material injected into the process chamber or into the constant purge/carrier gas stream. The pulse of the copper II β-diketonate compound lasts for a predetermined time interval.

The time interval for the pulse of the copper II β-diketonate compound is variable depending upon a number of factors such as, for example, the volume capacity of the process chamber employed, the vacuum system coupled thereto and the volatility/reactivity of the reactants used. For example, (1) a large-volume process chamber may lead to a longer time to stabilize the process conditions such as, for example, purge/carrier gas flow and temperature requiring a longer pulse time; (2) a lower flow rate for the process gas may also lead to a longer time to stabilize the process conditions requiring a longer pulse time; and (3) a lower chamber pressure means that the process gas is evacuated from the process chamber more quickly requiring a longer pulse time. In general, the process conditions are advantageously selected so that a pulse of the copper II β-diketonate compound provides a sufficient amount of compound so that at least a monolayer of the copper II β-diketonate compound is adsorbed on the substrate.

In step 307, the purge/carrier gas is provided to the process chamber in an amount from a brief pulse to flush excess copper II β-diketonate from where the reducing gas will be injected to a longer pulse sufficient to remove excess copper II β-diketonate from the process chamber prior to further processing. For example, a brief pulse of the purge gas could move excess copper II β-diketonate toward the edges of a substrate prior to injecting the reducing gas at the center of the substrate.

In step 308, a pulse of a reducing gas is added to the purge/carrier gas stream. The pulse of the reducing gas also lasts for a predetermined time interval that is variable as described above with reference to the copper II β-diketonate compound. In general, the time interval for the pulse of the reducing gas should be long enough for adsorption of at least a monolayer of the reducing gas on the copper II β-diketonate compound. The amount of reducing gas is preferably in excess of the amount required for complete conversion of the copper II β-diketonate compound to copper with desired film properties. In has been observed that the exposure time of reducing gas and its flow rate depends on the film property desired. Thereafter, excess reducing gas remaining in the chamber may be removed therefrom by the constant purge/carrier gas stream in combination with the vacuum system.

Steps 304 through 308 comprise one embodiment of a deposition cycle for copper. For such an embodiment, a constant flow of the purge/carrier gas is provided to the process chamber modulated by alternating periods of pulsing and non-pulsing where the periods of pulsing alternate between the copper II β-diketonate compound and the reducing gas along with the purge/carrier gas stream, while the periods of non-pulsing include only the purge/carrier gas stream.

The time interval for each of the pulses of the copper II β-diketonate compound and the reducing gas may have the same duration. That is the duration of the pulse of the copper II β-diketonate compound may be identical to the duration of the pulse of the reducing gas. For such an embodiment, a time interval ($T_1$) for the pulse of the copper II β-diketonate compound is equal to a time interval ($T_2$) for the pulse of the reducing gas.

Alternatively, the time interval for each of the pulses of the copper II β-diketonate compound and the reducing gas may have different durations. That is the duration of the pulse of the copper II β-diketonate compound may be shorter or longer than the duration of the pulse of the reducing gas. For such an embodiment, a time interval ($T_1$) for the pulse of the copper II β-diketonate compound is different than a time interval ($T_2$) for the pulse of the reducing gas. The pulse may also change for a particular gas between cycles. For example, the copper II β-diketonate pulse may increase or decrease with each cycle. The same can be true for the reducing gas.

In addition, the periods of non-pulsing between each of the pulses of the copper II β-diketonate compound and the reducing gas may have the same duration. That is the duration of the period of non-pulsing between each pulse of the copper II β-diketonate compound and each pulse of the reducing gas is identical. For such an embodiment, a time interval ($T_3$) of non-pulsing between the pulse of the copper II β-diketonate compound and the pulse of the reducing gas is equal to a time interval ($T_4$) of non-pulsing between the pulse of the reducing gas and the pulse of the copper II β-diketonate compound. During the time periods of non-pulsing only the constant purge/carrier gas stream is provided to the process chamber.

Alternatively, the periods of non-pulsing between each of the pulses of the copper II β-diketonate compound and the reducing gas may have different durations. That is the duration of the period of non-pulsing between each pulse of the copper II β-diketonate compound and each pulse of the reducing gas may be shorter or longer than the duration of the period of non-pulsing between each pulse of the reducing gas and the copper II β-diketonate compound. For such an embodiment, a time interval ($T_3$) of non-pulsing between the pulse of the copper II β-diketonate compound and the pulse of the reducing gas is different from a time interval ($T_4$) of non-pulsing between the pulse of the reducing gas and the pulse of the copper II β-diketonate compound. During the time periods of non-pulsing only the constant purge/carrier gas stream is provided to the process chamber.

Additionally, the time intervals for each pulse of the copper II β-diketonate compound, the reducing gas, and the periods of non-pulsing therebetween for each deposition cycle may have the same duration. For such an embodiment, a time interval ($T_1$) for the copper II β-diketonate compound, a time interval ($T_2$) for the reducing gas, a time interval ($T_3$) of non-pulsing between the pulse of the copper II β-diketonate compound and the pulse of the reducing gas compound and a time interval ($T_4$) of non-pulsing between the pulse of the reducing gas and the pulse of the copper II β-diketonate compound each have the same value for each deposition cycle. For example, in a first deposition cycle ($C_1$), a time interval ($T_1$) for the pulse of the copper II β-diketonate compound has the same duration as the time interval ($T_1$) for the pulse of the copper II β-diketonate compound in a second deposition cycle ($C_2$). Similarly, the duration of each pulse of the reducing gas compound and the periods of non-pulsing between the pulse of the copper II β-diketonate compound and the reducing gas in deposition cycle ($C_1$) is the same as the duration of each pulse of the reducing gas and the periods of non-pulsing between the pulse of the copper II β-diketonate compound and the reducing gas in deposition cycle ($C_2$), respectively.

Additionally, the time intervals for at least one pulse of the copper II β-diketonate compound, the reducing gas, and the periods of non-pulsing therebetween for one or more of the deposition cycles of the copper deposition process may have different durations. For such an embodiment, one or more of the time intervals ($T_1$) for the pulses of the copper II β-diketonate compound, the time intervals ($T_2$) for the pulses of the reducing gas, the time intervals ($T_3$) of non-pulsing between the pulse of the copper II β-diketonate compound and the pulse of the reducing gas, and the time intervals ($T_4$) of non-pulsing between the pulse of the reducing gas and the pulse of the copper II β-diketonate compound may have different values for one or more deposition cycles of the copper deposition process. For example, in a first deposition cycle ($C_1$), the time interval ($T_1$) for the pulse of the copper II β-diketonate compound may be longer or shorter than the time interval ($T_1$) for the pulse of the copper II β-diketonate compound in a second deposition cycle ($C_2$). Similarly, the duration of each pulse of the reducing gas and the periods of non-pulsing between the pulse of the copper II β-diketonate compound and the reducing gas in deposition cycle ($C_1$) may be the same or different than the duration of each pulse of the reducing gas and the periods of non-pulsing between the pulse of the copper II β-diketonate compound and the reducing gas in deposition cycle ($C_2$), respectively.

Referring to step 310, after each deposition cycle (steps 304 through 308) a thickness of copper will be formed on the substrate. Depending on specific device requirements, subsequent deposition cycles may be needed to achieve a desired thickness. As such, steps 304 through 308 are repeated until the desired thickness for the copper layer is achieved. Thereafter, when the desired thickness for the copper layer is achieved the process is stopped as indicated by step 312.

Figure 5:
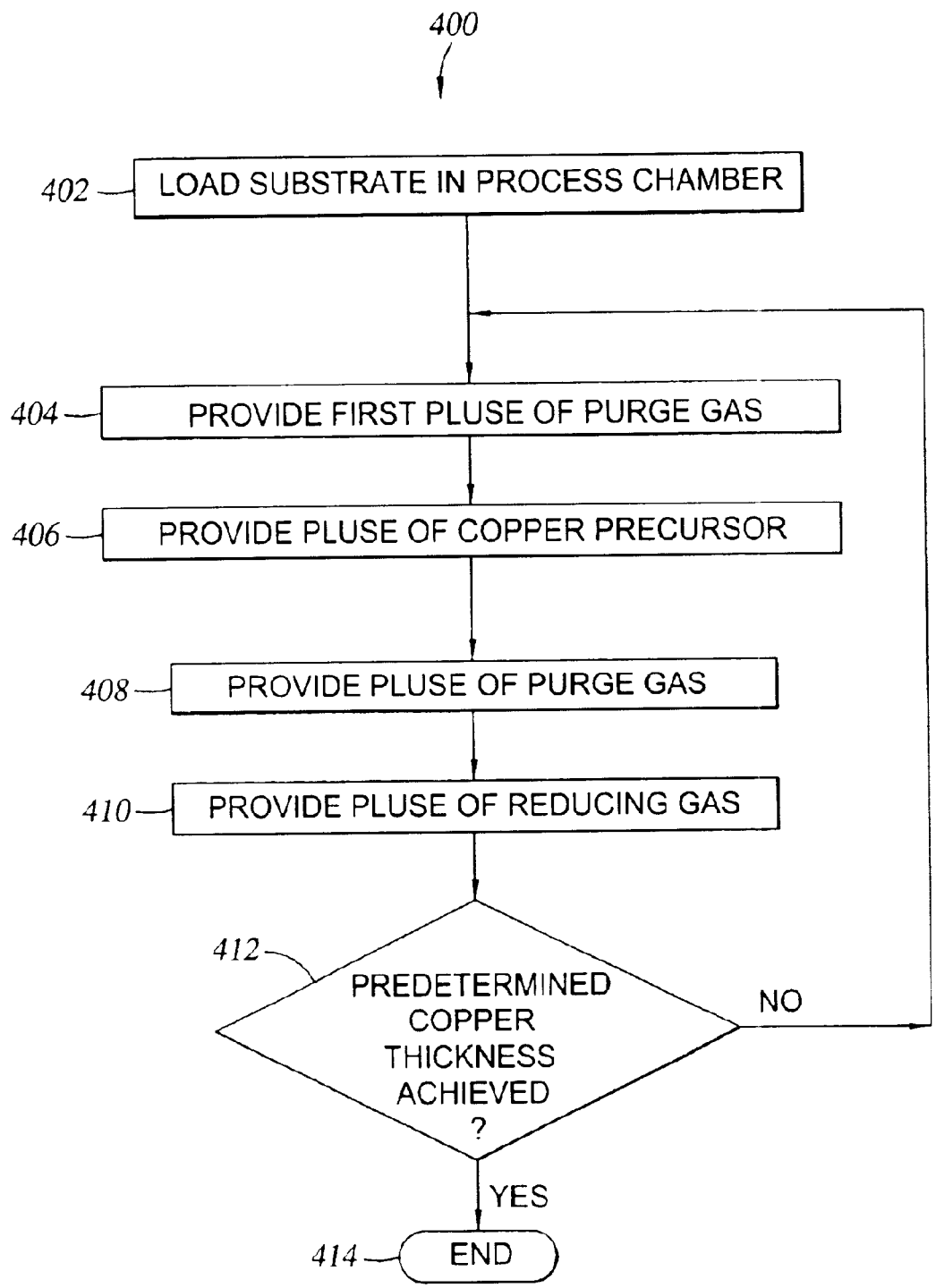
FIG. 5 illustrates a process sequence for the formation of a copper film using cyclical deposition techniques according to a another embodiment described herein.

In another process sequence described with respect to FIG. 5, the tungsten deposition cycle comprises separate pulses for each of copper II β-diketonate, reducing gas, and the purge/carrier gas to deposit a copper layer. For such an embodiment, a copper deposition sequence 400 includes providing a substrate to the process chamber (step 402), providing a first pulse of a purge/carrier gas to the process chamber (step 404), providing a pulse of the copper II β-diketonate to the process chamber (step 406), providing a second pulse of the purge/carrier gas to the process chamber (step 408), providing a pulse of the reducing gas to the process chamber (step 410), and then repeating steps 404 through 408 or stopping the deposition process (step 414) depending on whether a desired thickness for the copper layer has been achieved.

The time intervals for each of the pulses of the copper II β-diketonate, the reducing gas, and the purge/carrier gas may have the same or different durations as discussed above with respect to FIG. 4.

In FIGS. 4 and 5, the copper deposition cycle is depicted as beginning with a pulse of the copper II β-diketonate compound followed by a pulse of the reducing gas. Alternatively, the copper deposition cycle may start with a pulse of the reducing gas followed by a pulse of the copper II β-diketonate compound.

The copper II β-diketonate may be provided to an appropriate flow control valve, for example, an electronic control valve, at a flow rate of between about 10 sccm (standard cubic centimeters per minute) and about 400 sccm, preferably between about 20 sccm and about 100 sccm, and thereafter pulsed for about 2 seconds or less, preferably about 0.2 seconds or less. A purge/carrier gas comprising argon is provided along with the copper II β-diketonate at a flow rate between about 150 sccm to about 2000 sccm, preferably between about 500 sccm to about 750 sccm. The reducing gas may be provided to an appropriate flow control valve, for example, an electronic control valve, at a flow rate of between about 5 sccm and about 150 sccm, preferably between about 5 sccm and about 50 sccm, and thereafter pulsed for about 2 seconds or less, preferably about 0.2 seconds or less. A purge/carrier gas comprising argon is provided along with the reducing gas at a flow rate between about 250 sccm to about 1000 sccm, preferably between about 500 sccm to about 750 sccm. The flow rates of the gases can be adjusted between cycles so that one or more gas flows can be increased or descreased as deposition proceeds.

Hypothetical Example

A copper layer is deposited in the chamber of FIG. 3 at a heater temperature of 100° C. by flowing a copper precursor of FIG. 1 at 15 sccm and argon at 250 sccm for 0.5 seconds, flowing argon alone at 1000 sccm for 1 second, flowing ammonia at 25 sccm and argon at 500 sccm for 1 second, and then flowing argon alone at 1000 sccm for 1 second. Repetition of these steps deposits a copper layer having any desired thickness.

Copper Metallization

Figure 6A:
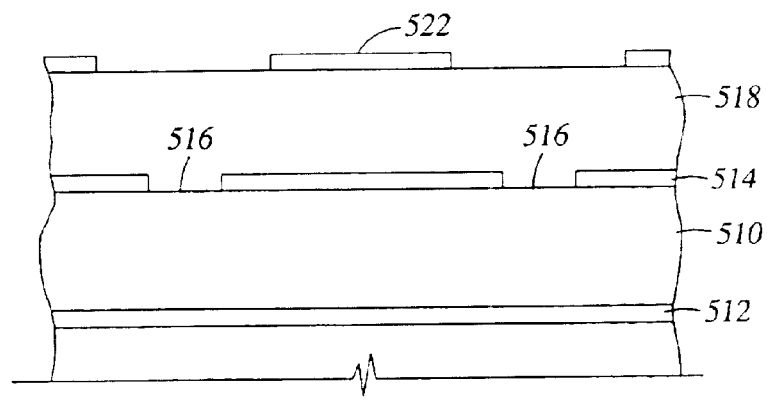
FIGS. 6A–6D depict cross-sectional views of substrates at different stages of a copper metallization sequence of the present invention.
Figure 6B:
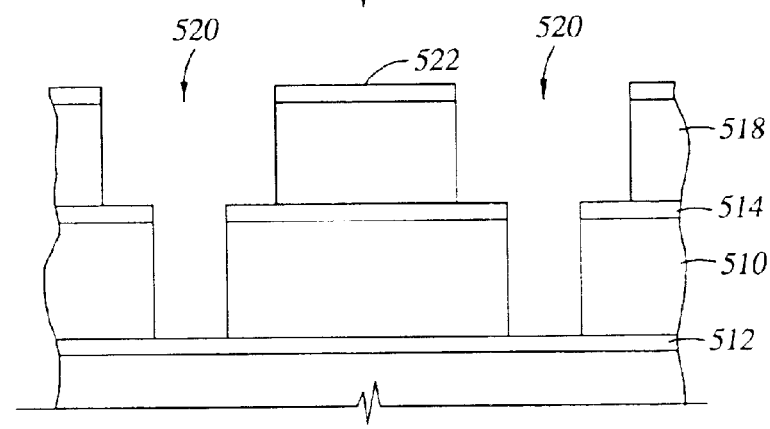

As shown in FIG. 6A, a first dielectric layer 510, such as parylene, silicon oxide, fluorine doped silicon oxide (e.g., FSG), spin on glass, carbon doped silicon oxide (e.g., Black Diamond™ insulating film available from Applied Materials, Inc.), SiLK™ dielectric film, or the like, is deposited on a substrate 512, e.g. to a thickness of about 5,000 to about 10,000 Å for subsequent formation of 0.13 μm features depending on the size of the structure to be fabricated. An etch stop 514, such as silicon carbide, silicon nitride, or the like is deposited on the first dielectric layer 510 to a thickness of about 200 to about 1000 Å. The etch stop 514 is pattern etched to define the contact/via openings 516 and to expose first dielectric layer 510 in the areas where the contacts/vias are to be formed. After etch stop 514 has been etched to pattern the contacts/vias and the photo resist has been removed, a second dielectric layer 518 is deposited over etch stop 514 to a thickness of about 5,000 to about 10,000 Å. The second dielectric layer 518 is patterned to define trenches, preferably using conventional photolithography processes with a photo resist layer 522. The trenches and contacts/vias 520 are then etched using reactive ion etching or other anisotropic etching techniques to define the metallization structure (i.e., the interconnect and contact/via) as shown in FIG. 6B. Any photo resist or other material used to pattern the etch stop 514 or the second dielectric layer 518 is removed using an oxygen strip or other suitable process.

Figure 6C:
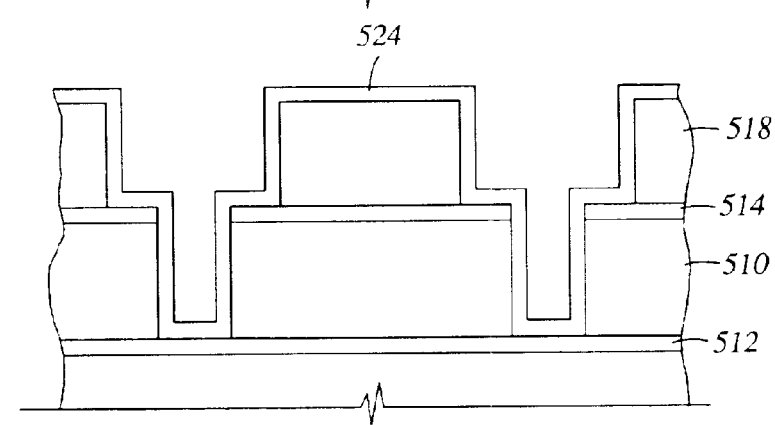
Figure 6D:
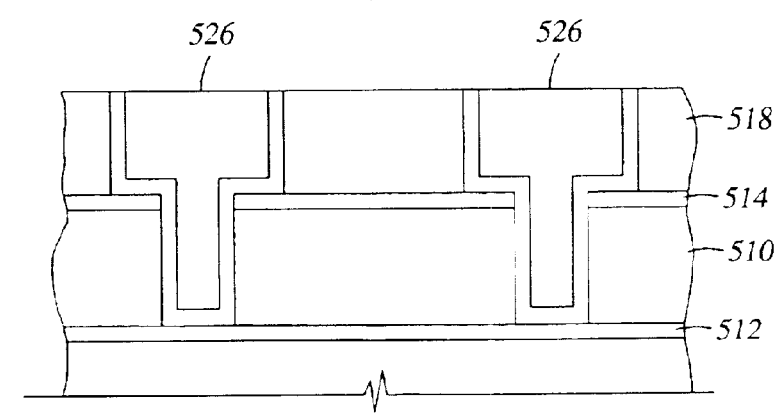

As shown in FIG. 6C, a suitable barrier layer 524, such as tungsten, is first deposited in the metallization pattern at a thickness between about 5 Å and about 1000 Å, such as between about 5 Å to about 100 Å, to prevent copper migration into the surrounding silicon and/or dielectric material. Thereafter, copper 526 is deposited by the sequence described in FIGS. 4 or 5 to form the conductive structure, as shown in FIG. 6D.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A method of forming a copper film on a substrate, comprising:

sequentially introducing a source reagent and a reducing gas during a deposition cycle within a process chamber, comprising:

flowing the source reagent having the chemical structure of FIG. 1 or FIG. 2, wherein R is hydrogen or methyl, R' is hydrogen or an alkyl group having from one to four carbon atoms, and R" is an alkyl group having from one to four carbon atoms into the process chamber, and wherein the source reagent is substantially free of solvents and excess ligands;

stopping the flow of the source reagent;

purging the source reagent from the process chamber;

flowing the reducing gas selected from the group of hydrogen, silane, organosilanes, ammonia, diborane, or combinations thereof into the process chamber;

stopping the flow of the reducing gas; and purging the reducing gas from the process chamber.

2. A method of forming a copper film on a substrate, comprising:

sequentially introducing a source reagent and a reducing gas during a deposition cycle within a process chamber, comprising:

flowing the source reagent having the chemical structure of FIG. 1 or FIG. 2. wherein R and R' are hydrogen, R" is an alkyl group having from one to four carbon atoms into the process chamber, and the source reagent is purified by sublimation;

stopping the flow of the source reagent;

purging the source reagent from the process chamber;

flowing the reducing as selected from the group of hydrogen, silane, organosilanes, ammonia, diborane, or combinations thereof into the process chamber;

stopping the flow of the reducing gas; and purging the reducing gas from the process chamber.

3. The method of claim 2, wherein R" is ethyl.

* * * * *